United States Patent
Kawakubo et al.

[11] Patent Number: 5,909,389
[45] Date of Patent: Jun. 1, 1999

[54] SEMICONDUCTOR MEMORY DEVICE USING FERROELECTRIC CAPACITOR

[75] Inventors: Takashi Kawakubo, Yokohama; Kazuhide Abe, Kawasaki, both of Japan

[73] Assignee: Kabushiki Kaisha Toshiba, Kawasaki, Japan

[21] Appl. No.: 08/883,600

[22] Filed: Jun. 26, 1997

[30] Foreign Application Priority Data

Jun. 28, 1996 [JP] Japan ..................... 8-169752

[51] Int. Cl.[6] ..................... G11C 11/22
[52] U.S. Cl. ..................... 365/145; 365/189.05
[58] Field of Search ............. 365/189.05, 145

[56] References Cited

U.S. PATENT DOCUMENTS 5,629,888  5/1997  Saito et al. .................. 365/145
5,668,753  9/1997  Koike ......................... 365/145

OTHER PUBLICATIONS

S. Aggarwal, et al. "Hysteresis Relaxation In (Pb, La)(Zr, Ti)$O_3$ Thin Film Capacitors With (La, Sr)Co$O_3$ Electrodes", Appl. Phys. Lett., vol. 69, No. 17, Oct. 1996, pp.2540–2542.

K. Abe, et al., Japan Ceramics Society, The 15th Electronics Seminar, Feb. 2, 1997, pp. 72–84, "Ferroelectricity of Pt/(Ba, Sr)Tio3/SrRuO3 Thin Films".

K. Abe, et al., Proceedings of the 14th Meeting on Ferroelectric Materials and Their Applications, May 28, 1997, pp. 153–154, "Asymmetric hysteresis and anomalous leakage current in heteroepitaxial BaTiO3 Films".

*Primary Examiner*—David Nelms
*Assistant Examiner*—M. Tran
*Attorney, Agent, or Firm*—Oblon, Spivak, McClelland, Maier & Neustadt, P.C.

[57] ABSTRACT

A semiconductor memory device has a plurality of memory cells arranged in a matrix format. Each memory cell includes a thin film capacitor with a ferroelectric film and a pair of electrodes opposing each other through the ferroelectric film, and a transfer gate MOS transistor arranged to be connected to the thin film capacitor. The operating voltage value corresponding to the central axis of the polarization hysteresis characteristic curve of the thin film capacitor shifts from 0V by Vf. When no write or read operation is performed for the memory cell, the transistor is turned on, and an adjustment voltage set to be from 0 to 2 Vf is constantly applied across the electrodes of the thin film capacitor.

24 Claims, 3 Drawing Sheets

SEMICONDUCTOR MEMORY DEVICE USING FERROELECTRIC CAPACITOR

BACKGROUND OF THE INVENTION

The present invention relates to a semiconductor memory device using a capacitor with a ferroelectric thin film.

Recently, memory devices (ferroelectric memories) using ferroelectric thin films as storage media have been developed, and some have already been used in practical applications. The ferroelectric memory is nonvolatile and does not lose its memory contents after the power supply is turned off. When the film is sufficiently thin, spontaneous polarization can be quickly inverted to enable high-speed write and read operations, like the DRAM. Further, a large capacity is also attained because a 1-bit memory cell can be constituted by one transistor and one ferroelectric capacitor.

A ferroelectric thin film suitable for the ferroelectric memory must have large residual polarization, low temperature dependency of residual polarization, a long holding time (retention) of residual polarization, and the like.

At present, as a ferroelectric material, lead zirconate titanate (PZT) is mainly used. PZT is a solid solution of lead zirconate and lead titanium. PZT having a molar ratio of almost 1:1 in the solid solution is considered to be excellent as a storage medium because its spontaneous polarization is large to allow inversion even with a low electric field. Since the transition temperature (Curie temperature) of PZT between the ferroelectric phase and the paraelectric phase is as relatively high as 300° C. or higher, the stored contents are hardly lost by heat within the use temperature range (120° C. or lower) of a normal electronic circuit.

However, a high-quality PZT thin film is difficult to fabricate due to the following reason. First, since lead as the main component of PZT easily evaporates at 500° C. or higher, the composition is difficult to accurately control in sputtering and subsequent annealing. Second, PZT exhibits ferroelectric properties only when it forms a perovskite crystal structure. PZT having this perovskite crystal structure is rarely obtained, and a crystal structure called pyrochlore is easily obtained. When PZT is applied to a silicon device, lead as the main component is difficult to be prevented from diffusing into silicon, and is easily reduced in a reduction atmosphere in the device process to lose the ferroelectric properties.

Barium titanate ($BaTiO_3$) is known as a typical ferroelectric, other than PZT. Barium titanate also has a perovskite crystal, like PZT, and its Curie temperature is about 120° C. Since barium constituting barium titanate rarely evaporates, compared to lead, the composition is relatively easily controlled in forming a barium titanate thin film. When barium titanate crystallizes, most crystal structures are of the perovskite type.

Regardless of these advantages, a thin film capacitor using barium titanate is hardly examined as the storage medium of the ferroelectric memory because the residual polarization of barium titanate is smaller than that of PZT, and the temperature dependency of its residual polarization is high. This is because the Curie temperature of barium titanate is as low as 120° C. When a ferroelectric memory is formed using barium titanate, its memory contents may be lost upon exposure to a high temperature of 100° C. or higher. In addition, the temperature dependency of residual polarization is high even in the use temperature range (85° C. or lower) of a normal electronic circuit, and the operation is unstable. Therefore, a thin film capacitor using a ferroelectric thin film of barium titanate is considered to be unsuitable as the storage medium of the ferroelectric memory.

BRIEF SUMMARY OF THE INVENTION

The present inventors have found that a new ferroelectric thin film could be obtained by employing the following material and film formation method. More specifically, a dielectric material (e.g., barium strontium titanate ($Ba_xSr_{1-x}TiO_3$) to be referred to as BST hereinafter) having a lattice constant slightly larger than that of a lower electrode (e.g., (100) plane-Pt) is used as a dielectric material. Epitaxial growth is caused in the c-axis direction as the polarization axis by employing a film formation method called RF magnetron sputtering in which misfit dislocations are rarely generated during film formation. In this case, even in a thin film having a relatively large thickness of 200 nm or more, it is possible to maintain the lattice constant larger in the direction of thickness (c-axis direction) and smaller in the in-plane direction (a-axis direction), as compared with the original dielectric, due to the epitaxial effect. As a result, there can be realized a ferroelectric thin film in which the ferroelectric Curie temperature shifts to the high-temperature side, large residual polarization is obtained within the room temperature range, and sufficiently large residual polarization can be held even if the temperature is increased to about 85° C.

Such a ferroelectric thin film can be fabricated by using, as a lower electrode, Pt (lattice constant a: 0.39231) which is hardly oxidized, and setting the composition range of BST ($Ba_xSr_{1-x}TiO_3$) to "x=0.30 to 0.90". In this case, realization of the following ferroelectric characteristics suitable for practical applications has been experimentally confirmed. That is, ferroelectric properties are exhibited even in a composition range ($x \leq 0.7$) in which they should not originally be exhibited at room temperature, while the Curie temperature originally higher than room temperature further increases in a composition range ($x > 0.7$) in which the ferroelectric properties are originally exhibited.

From subsequent experiments by the present inventors, it has been found that the following problems occur when the above system, i.e., a ferroelectric thin film, in which ferroelectric properties are exhibited or strengthened by using Pt as a lower electrode and a BST epitaxial film as a ferroelectric, is used as the storage medium of a nonvolatile memory.

More specifically, when this ferroelectric thin film is used, large residual polarization of 0.2 $c/m^2$ can be obtained at room temperature, and a relatively polygonal hysteresis shape can be obtained. However, the center of the hysteresis greatly shifts to the positive voltage side (assume that the upper electrode of the capacitor is positive) (see FIG. 3). When this ferroelectric thin film is used for a nonvolatile memory, polarization only in one direction is extremely stabilized, and that in the other direction is difficult to be kept stable for a long time. As a result, the nonvolatile memory is difficult to stably operate.

It is an object of the present invention to provide a semiconductor memory device capable of stably holding information stored in a memory cell when a memory cell is constituted using a capacitor in which the central axis of the polarization hysteresis characteristic curve shifts in the positive or negative direction in the above manner.

The present inventors have newly found that residual polarization in both the positive and negative directions is stably held by continuously applying an adjustment voltage, in consideration of a shift of the central operating voltage value of the ferroelectric hysteresis curve, across the two electrodes of a ferroelectric capacitor using a ferroelectric thin film exhibiting ferroelectric properties by the epitaxial effect, or a ferroelectric thin film having ferroelectric properties strengthened by the epitaxial effect. The present invention is based on this fact.

According to the present invention, there is provided a semiconductor memory device comprising a plurality of memory cells arranged in a matrix format, each memory cell having a thin film capacitor with a ferroelectric film and a pair of electrodes opposing each other through the ferroelectric film, and a transfer gate transistor arranged to be connected to the thin film capacitor, in which an operating voltage value corresponding to a central axis of a polarization hysteresis characteristic curve of the thin film capacitor has a shift from 0V, drive means for driving the transistor and the thin film capacitor in order to perform write and read operations for the memory cells, and adjustment means for keeping a potential difference between the electrodes of the capacitor within a certain range excluding zero when no write or read operation is performed for a corresponding memory cell.

More specifically, when no write or read operation is performed for the memory cell, the potential difference between the two electrodes of the capacitor is held within a predetermined range of 0 to 2 Vf corresponding to the shift Vf of the central axis of the hysteresis characteristics.

With the above arrangement, since the potential difference between the two electrodes of the capacitor is held within the predetermined range of 0 to 2 Vf, the asymmetry of the hysteresis characteristics based on the shift of the central axis of the polarization hysteresis characteristic curve in the positive or negative direction can be subjected to pseudo correction. As a result, residual polarization of the capacitor in both the positive and negative directions is stably held, so that information stored in the memory cell can be stably held.

In the above semiconductor memory device, an I/O mode for performing write and read operations, and a low-power-consumption standby mode can be set. The semiconductor memory device can be constituted such that one of the source and drain of a MOS transistor in the memory cell is connected to one of the electrodes of the capacitor in the memory cell, the gate of the MOS transistor is connected to the first wiring line (word line), the other one of the source and drain of the MOS transistor is connected to the second wiring line (bit line), and the other electrode of the capacitor is connected to the third wiring line (drive line). In this case, the following three types of methods can be employed as a method for holding the potential difference between the two electrodes of the capacitor within a predetermined range in the standby mode.

(1) In the first method, the MOS transistor is turned on, and an adjustment voltage set at 0 to 2 Vf is applied across the second wiring line (bit line) and the third wiring line (drive line), and statically held. In this case, since the MOS transistor is kept on, the adjustment voltage can be continuously applied to the capacitor.

(2) The second method is to quasi-statically perform the above method (1). That is, the MOS transistor is periodically turned on, while the adjustment voltage set at 0 to 2 Vf is periodically applied across the second wiring line (bit line) and the third wiring line (drive line). In this case, one of the electrodes of the capacitor is charged to the potential of the second wiring line (bit line) through the MOS transistor, while the other electrode thereof is charged to the potential of the third wiring line (drive line). Even in the floating state upon completion of charging, a voltage almost equal to the adjustment voltage is applied to the capacitor.

(3) The third method is to turn off the MOS transistor, and to apply the adjustment voltage set at 0 to 2 Vf across the third wiring line (drive line) and the substrate and statically hold it. In this case, if the leakage current between the two electrodes of the capacitor is smaller than the leakage current (junction leakage) between the MOS transistor and the substrate, a voltage applied to the third wiring line (drive line) and the substrate is mainly applied to the capacitor. Therefore, most of the adjustment voltage can be continuously applied to the capacitor.

With the above methods, since the potential difference between the two electrodes of the capacitor is statically or quasi-statically held without requiring any short-period refresh operation, unlike the DRAM, almost no charge/discharge current of the capacitor is generated. A current consumed in the memory cell is only the leakage current of the capacitor and a current based on the junction leakage of the MOS transistor. For this reason, the power consumption becomes much lower than that of the DRAM, and can be decreased to that of an SRAM capable of holding the data with a backup battery. Therefore, a new semiconductor memory device having a high integration degree and a high operation speed, like the DRAM, and a low power consumption, like the SRAM can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
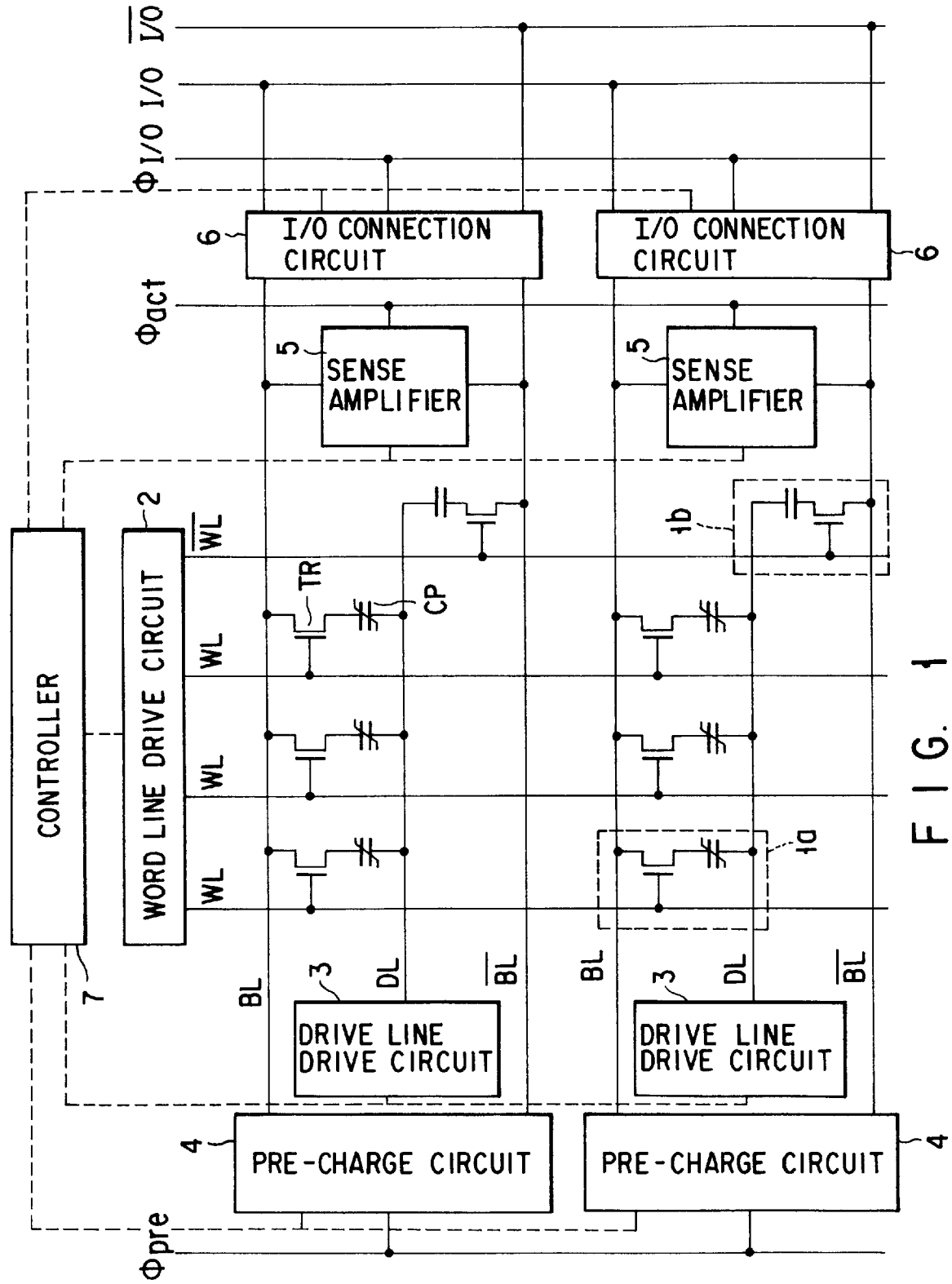
FIG. 1 is a diagram showing an example of the circuit configuration of a semiconductor memory device according to an embodiment of the present invention.

FIG. 1 is a diagram showing an example of the circuit configuration of a memory device according to an embodiment. This circuit has almost the same configuration as that of a general DRAM using one capacitor and one transfer gate MOS transistor in one memory cell.

An active cell 1a (memory cell) is constituted by a transfer gate MOS transistor TR and a capacitor CP using a ferroelectric thin film. As described above, the capacitor CP is constituted using a ferroelectric thin film exhibiting ferroelectric properties by the epitaxial effect, or a ferroelectric thin film having ferroelectric properties strengthened by the epitaxial effect, and the central axis of the polarization hysteresis characteristic curve shifts in the positive or negative direction.

One of the source and drain of the MOS transistor TR, and one electrode of the capacitor CP are electrically connected to each other. The gate of the MOS transistor TR is connected to a word line WL, the other of the source and drain thereof is connected to a bit line BL, and the other electrode of the capacitor CP is connected to a drive line DL. The word line WL is connected to a word line driving circuit 2, and the drive line DL is connected to a drive line BL is circuit 3. One terminal of the bit line BL is connected to a pre-charge circuit 4, while the other is connected to an I/O connection circuit 6 through a connection terminal connected to a sense amplifier 5.

A dummy cell 1b and elements associated with this also have almost the same arrangements, and a description thereof will be omitted.

The above-described circuits 2, 3, 4, and 6, the sense amplifier 5, and the like are controlled by a controller 7 to execute processing necessary for the I/O mode for performing write and read operations, the standby mode, and the like (to be described later). That is, the I/O mode for performing write and read operations, and the low-power-consumption standby mode are set in the memory circuit of the controller 7.

The following three types of methods can be employed as a method for holding the potential difference between the two electrodes of the capacitor CP within a predetermined range in the standby mode. Note that an adjustment voltage $V_{adj}$ in the following description can be set on the basis of the central operating voltage value of the hysteresis in the polarization-voltage hysteresis characteristic curve of the ferroelectric thin film capacitor. More specifically, when the central axis of the hysteresis corresponds to an operating voltage value Vf, i.e., when the central axis is shifted from 0V by Vf, the adjustment voltage $V_{adj}$ is set to satisfy $0 < V_{adj} < 2$ Vf. The adjustment voltage $V_{adj}$ must be set lower than the absolute values of the read and write voltages.

(1) The MOS transistor is turned on (for an enhancement MOS transistor, an ON voltage is applied to the word line WL; for a depletion MOS transistor, a voltage of 0V is applied). The adjustment voltage $V_{adj}$ is applied across the bit and drive lines and statically kept. In this case, since the MOS transistor is kept on, the adjustment voltage $V_{adj}$ can be continuously applied to the capacitor.

(2) This is a method of quasi-statically performing the above method (1). More specifically, after the drive line and the bit line are respectively charged to the adjustment potential $V_{adj}$ and a potential of 0V at a certain interval, they are held in the floating state. The MOS transistor is also periodically turned on at a given interval. In this case, one terminal of the capacitor is set to the potential of the bit line through the MOS transistor in the ON state, while the other terminal thereof is set to the potential of the drive line. Even in the floating state, a voltage almost equal to the adjustment voltage $V_{adj}$ is applied to the capacitor.

(3) The MOS transistor is turned off (for the enhancement MOS transistor, a voltage of 0V is applied to the word line; for the depletion MOS transistor, an OFF voltage is applied). The adjustment voltage $V_{adj}$ is applied across the drive line and the substrate and statically held. In this case, the leakage current between the two electrodes of the capacitor must be smaller than the leakage current (junction leakage) between the MOS transistor and the substrate. In this state, since most of the voltage applied across the drive line and the substrate is applied to the capacitor, the adjustment voltage $V_{adj}$ can be continuously applied to the capacitor.

When the standby mode based on the above method (1) is employed, the highest reliability is attained in terms of data holding, and the power consumption is low because the potential difference between the two electrodes of the capacitor is statically held. However, all the MOS transistors must be turned on. On the other hand, in the I/O mode capable of input and output, only specific word, bit, and drive lines must be selected on the basis of a designated address, and a memory cell at the intersection between the selected word and bit lines must be subjected to a write or read operation. Therefore, the standby mode must be switched to the I/O mode, and method (1) cannot be used during the I/O mode.

However, both the above methods (2) and (3) can be used during the I/O mode. In the I/O mode, data can be held by method (2) or (3). Instead, data can be held by sequentially performing write and read refresh operations for each memory cell at intervals between write and read operations, like the DRAM.

When the above method (2) is employed for the standby mode, the MOS transistor TR is simply periodically turned on. Even in the I/O mode, write and read operations, and a data holding operation can be alternately performed.

When the above method (3) is employed for the standby mode, the standby mode can be directly shifted to the I/O mode because all the MOS transistors are in the OFF state.

Also in the I/O mode, the adjustment voltage $V_{adj}$ is preferably applied across the bit and drive lines in performing write and read operations in order to correct the shift of the hysteresis characteristics.

An example of the process of manufacturing the active cells 1a and 1b shown in FIG. 1 and associated elements will be described with reference to FIGS. 2A to 2F.

Figure 2A:
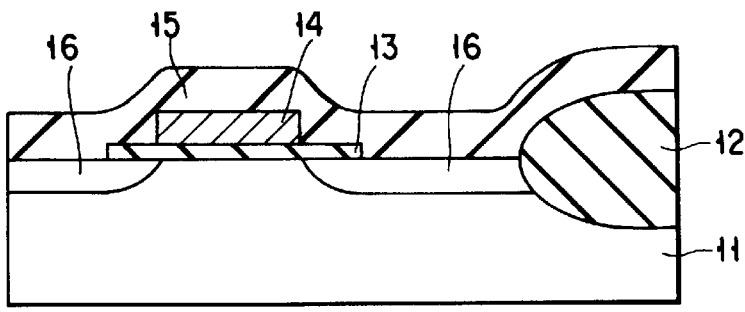
FIGS. 2A to 2F are sectional views, respectively, showing a method of manufacturing the semiconductor memory device according to the embodiment of the present invention.

Referring to FIG. 2A, on a silicon substrate 11 of one (first conductivity type) of the n- and p-conductivity types, an element isolation field oxide film 12, a gate oxide film 13, a word line 14, an interlevel insulating film 15, and an impurity diffusion layer 16 of the other (second conductivity type) of the n- and p-conductivity types are formed by a method of manufacturing a normal depletion MOS transistor.

Figure 2B:
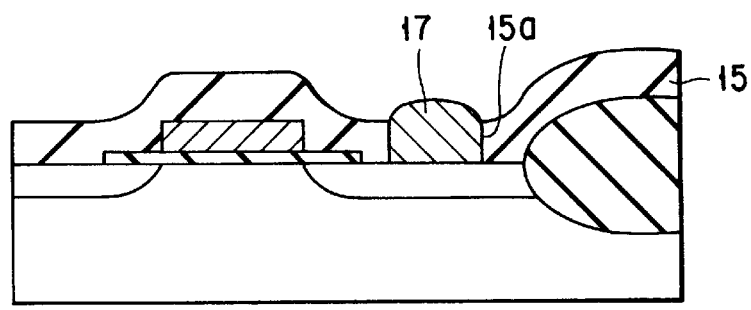
Figure 2C:
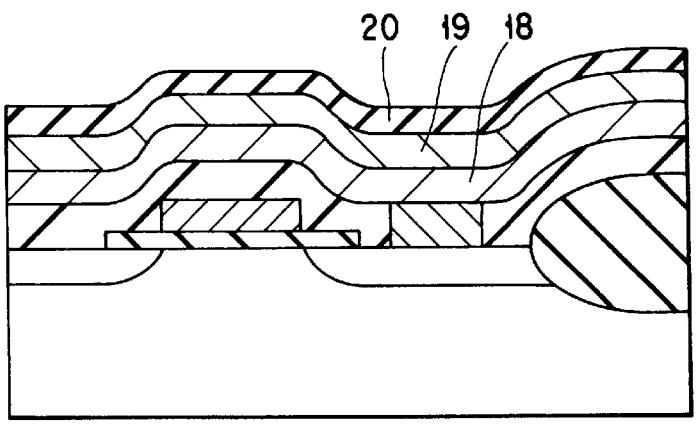

A contact hole 15a is formed in the interlevel insulating film 15. In this case, the interlevel insulating film 15 is etched by RIE to a depth about 80% its thickness. Then, etching is performed to the surface of the silicon substrate 11 with an aqueous hydrofluoric acid solution to expose the (100) plane of silicon. A single-crystal silicon contact plug 17 is formed on the (100) plane of silicon in the contact hole 15a in the <100> direction by silicon selective growth CVD. The contact plug 17 is formed by LPCVD using dichlorosilane as a source gas at a growth temperature of 800° C. (FIG. 2B).

The contact plug 17 is etched back and planarized by selective wet etching using hydrofluoric acid. A TiN film 18 serving as a barrier metal, a strontium ruthenate thin film 19 serving as the lower electrode of the capacitor, and a BST thin film 20 (Ba molar fraction of 70%, thickness of 50 nm) are epitaxially grown in the <100> direction by reactive sputtering at a temperature of 600° C., by sputtering at a temperature of 600° C., and by RF magnetron sputtering at a temperature of 600° C., respectively. At this time, a film exhibiting the ferroelectric properties due to the epitaxial effect or having the ferroelectric properties strengthened thereby is formed as the BST thin film 20, as described above (FIG. 2C).

Figure 2D:
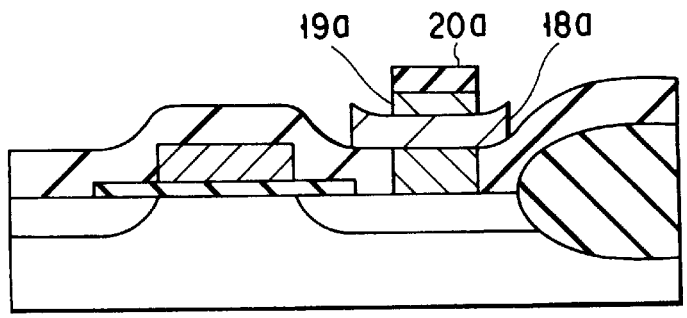

The TiN film 18, the strontium ruthenate thin film 19, and the BST thin film 20 are patterned by photolithography and ion etching, thereby forming a barrier metal pattern 18a, a lower electrode pattern 19a, and a ferroelectric thin film pattern 20a (FIG. 2D).

Figure 2E:
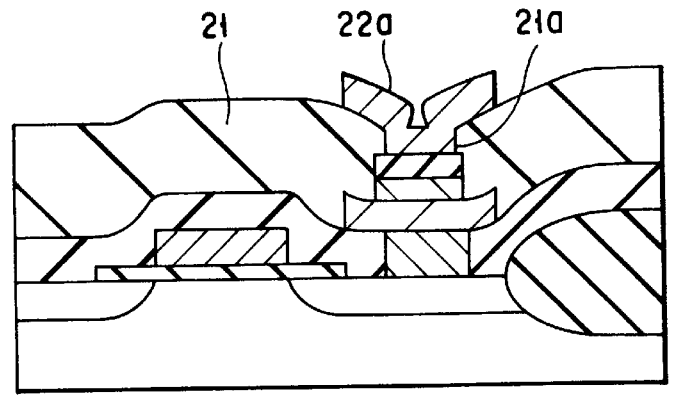

After an interlevel insulating film 21 is deposited, a contact hole 21a is formed in the interlevel insulating film 21 by photolithography and ion etching. A nickel film is formed and then patterned to form an upper electrode 22a of the capacitor (FIG. 2E).

Figure 2F:
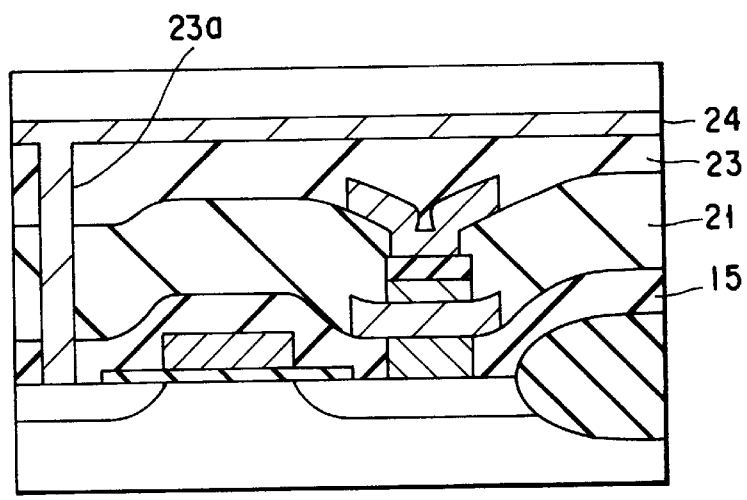

After an interlevel insulating film 23 is formed, a contact hole 23a is formed in the interlevel insulating films 15, 21, and 23 by photolithography and ion etching. The contact hole 23a is buried with a wiring material, and a bit line 24 is formed (FIG. 2F).

Figure 3:
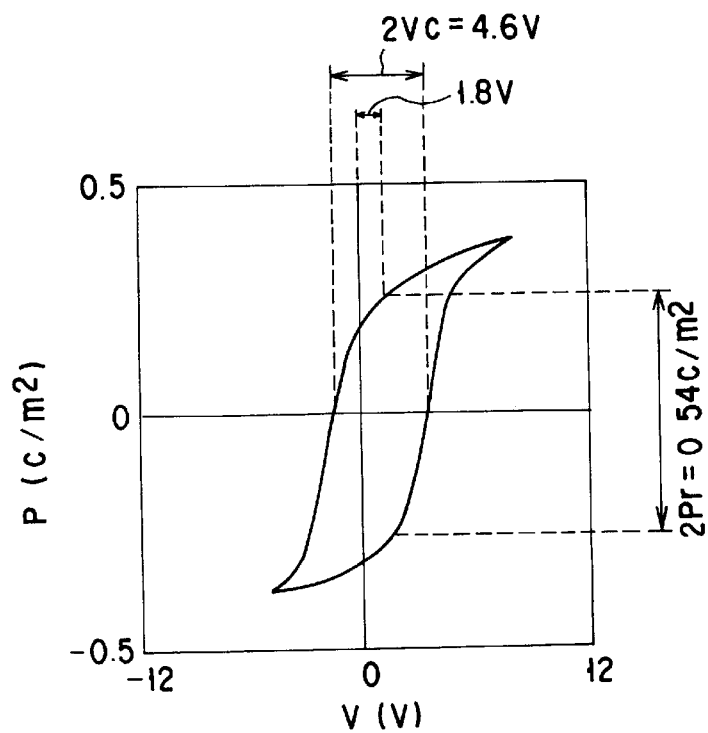
FIG. 3 is a graph showing the polarization hysteresis characteristic curve of a ferroelectric thin film used in the semiconductor memory device according to the embodiment of the present invention.

FIG. 3 shows the measurement results of the polarization-voltage hysteresis characteristics of the ferroelectric thin film capacitor formed in the above manner. The residual polarization amount was as large as Pr=0.27 c/m$^2$, and the coercive voltage was 2 Vc=4.6V. The central operating voltage value of the hysteresis was not 0V but shifted from 0V to the positive side by 1.8V.

After a pulse voltage of ±5V was applied for 1 μs to perform write, and the ferroelectric thin film capacitor was held at 0V, a pulse of ±5V (the direction was opposite to that in the write operation) was applied for 1 μs to perform a read operation, and the polarization holding characteristics were measured. As a result, the residual polarization amount in the negative direction hardly changed within a measurement time of 10 hours. To the contrary, although the residual polarization amount in the positive direction was 80% of the initial value after 1 hour to substantially hold the data holding state, it was about 40% of the initial value after 10 hours, and good holding characteristics could not be obtained over a long time.

After a pulse voltage of 1.8±3V was applied for 1 μs to perform a write operation, and the ferroelectric thin film capacitor was held at 1.8V, a pulse voltage (the direction was opposite to that in the write operation) of 1.8±3V was applied for 1 μs to perform a read operation, and the polarization holding characteristics were measured. That is, the write, holding, and read operations were performed using the operating voltage of 1.8V corresponding to the shifted central axis of the hysteresis as the adjustment voltage $V_{adj}$. As a result, the residual polarization amounts in both the positive and negative directions hardly changed within a measurement time of 5 hours, and good holding characteristics could be attained.

From the measurement results of the leakage current when the adjustment voltage $V_{adj}$=1.8V was held, it was confirmed that the leakage current was as very small as about 1 nA/cm$^2$ or less after 1,000 sec.

From these results, it was confirmed that the ferroelectric thin film capacitor satisfactorily stably functioned as a capacitor for a nonvolatile semiconductor memory device.

Note that the adjustment voltage $V_{adj}$ need not always be set equal to the operating voltage value Vf (shift amount from 0V) of the central axis of the hysteresis, and may be set only to satisfy 0<$V_{adj}$<2 Vf. The adjustment voltage $V_{adj}$ value must be set smaller than the absolute values of the read and write voltages.

The material of the ferroelectric thin film can be a ferroelectric material having a perovskite crystal structure represented by a composition of $Ba_x\alpha_{1-x}Ti_y\beta_{1-y}O_3$ (0<x≦1, 0<y≦1) wherein α consists of one or a plurality of materials selected from the group consisting of Sr and Ca, and β consists of one or a plurality of materials selected from the group consisting of Sn, Zr, Hf, Mg, Ta, Nb, and Zn. For example, β includes alloys such as $Mg_{1/3}Ta_{2/3}$, $Mg_{1/3}Nb_{2/3}$, $Zn_{1/3}Nb_{2/3}$, and $Zn_{1/3}Ta_{2/3}$.

The material of the lower electrode which provides an underlying surface for growing the ferroelectric thin film includes noble materials such as platinum, gold, palladium, iridium, rhodium, rhenium, and ruthenium, alloys thereof, and oxides thereof, and perovskite conductive oxides such as strontium ruthenate and strontium molybdate.

In the thin film capacitor using such a material according to this embodiment, one electrode (lower electrode) provides an underlying surface orientated in one direction. With this structure, the ferroelectric thin film can become a single-crystal film grown on the underlying surface, or a polycrystalline film grown on the underlying surface and orientated in one direction between the electrodes. Since the lattice constant of the underlying surface is smaller than that of the material of the ferroelectric thin film, the crystal of the ferroelectric thin film is deformed by the influence of the underlying surface such that its lattice constant decreases in the direction parallel to the underlying surface and increases in the direction of thickness. As a result, there can be realized a ferroelectric thin film in which the ferroelectric Curie temperature shifts to the high-temperature side, large residual polarization is obtained within the room temperature range, and sufficiently large residual polarization can be held even if the temperature is increased to about 85° C.

The first example of the operation mode of the memory device in FIG. 1 will be explained below. In this example, the ferroelectric thin film capacitor shown in FIGS. 2A to 2F is used as the capacitor CP constituting the memory cell (active or dummy cell 1a or 1b) in FIG. 1, and an enhancement transistor is used as the transfer gate MOS transistor TR. In the following description, "" is an inversion symbol of a signal, a signal line, and the like (for example, the inverted signal line "BL" is represented by "BL'").

The standby mode for holding digital information (logic value of 0 or 1) stored in the capacitor CP will be first explained.

In the standby mode, the potentials of the bit lines BL and BL' are held at 0V by the pre-charge circuits 4. The potential of the drive line DL is held at the adjustment potential $V_{adj}$ (1.8V in this case) by the drive line drive circuits 3. The potentials of the word lines WL and WL' are held by the word line drive circuit 2 at a voltage for turning on all the MOS transistors TR. As a result, one electrode of each capacitor CP (lower electrode 19a in FIGS. 2A to 2F) is held at the potential (0V) of the bit line BL or BL' through the MOS transistor TR, while the other electrode thereof (upper electrode 22a in FIGS. 2A to 2F) is held at the potential of the drive line DL, i.e., $V_{adj}$ (1.8V). Therefore, the potential difference $V_{adj}$ suitable for data holding is applied to the capacitor CP.

A method of writing digital information (logic value of 0 or 1) in the capacitor CP in the I/O mode will be explained.

To switch the standby mode to the I/O mode, all the word lines WL and WL' are set to 0V to turn off the MOS transistors TR.

In this case, complementary signals corresponding to signals to be externally written are supplied to input lines I/O and I/O' in advance. Assume that a potential of 3V is applied to the line I/O, and a complementary potential of 0V is applied to the line I/O'.

The bit lines BL and BL' are held at 0V by the pre-charge circuit 4 in the standby mode. In a specific row corresponding to address information representing the position of a memory cell subjected to a write operation, a pre-charge signal $\phi_{pre}$ is disabled before the shift to the write operation, setting the bit lines BL and BL' in a state disconnected from all the power supplies (floating state). At this time, the pre-charge state of the bit lines BL and BL' in the remaining rows are not canceled.

Then, to connect the bit line BL to the input line I/O, and the bit line BL' to the input line I/O', a signal $\phi_{I/O}$ is activated in the specific row corresponding to the address information representing the position of the memory cell subjected to the write operation. As a result, in this specific row, the potentials of the bit line BL and the input line I/O are equalized, while those of the bit line BL' and the input line I/O' are equalized. That is, the potential corresponding to information to be written is supplied to the bit lines BL and BL'.

To stabilize the potentials of the pair of bit lines BL and BL' set in this stage, the sense amplifier 5 connected to this pair of bit lines BL and BL' is activated. As a result, the potential of the bit line BL is fixed by the activated sense amplifier to a voltage $V_{write}$ (3.0V in this case) high enough to invert polarization of the capacitor CP.

In a specific column corresponding to the address information representing the position of the memory cell subjected to the write operation, a voltage required to turn on the MOS transistor TR is applied to the word line. The bit line is connected to the capacitor through the turned-on MOS transistor. At the time, in the columns except for the corresponding column, the bit lines and the capacitors remain electrically disconnected because no voltage for turning on the MOS transistors is applied to the word lines.

The potential of the drive line DL is initially fixed to the adjustment voltage $V_{adj}$ (1.8V) subsequently to the standby mode. After an elapse of a predetermined time upon turning on the MOS transistor, the drive line DL is controlled to have a voltage $V_{adj}+V_{write}$ (1.8V+3.0V) high enough to invert polarization of the capacitor. This operation will be described in detail below.

When the potential of the drive line DL is fixed to the adjustment voltage $V_{adj}$, the write operation is performed for the capacitor CP connected between the drive line DL and the bit line BL due to a potential difference $V_{adj}-V_{write}$ (1.8V–3.0V) generated between the drive line DL and the bit line BL (potential $V_{write}$=3.0V). At this time, the potential difference between the drive line DL (potential $V_{adj}$=1.8V) and the bit line BL' (potential=0) is $V_{adj}$ (1.8V). Since this potential difference just corresponds to the central position of the hysteresis characteristics (see FIG. 3), no change occurs in a capacitor CP connected between the drive line DL and the bit line BL'.

When the potential of the drive line DL becomes $V_{adj}+V_{write}$ after an elapse of a predetermined time upon turning on the MOS transistor, the write operation is performed for the capacitor CP connected between the drive line DL and the bit line BL' due to the potential difference $V_{adj}+V_{write}$ (1.8V+3.0V) generated between the drive line DL and the bit line BL'. At this time, the potential difference between the drive line DL (potential $V_{adj}+V_{write}$=1.8V+3.0V) and the bit line BL (potential $V_{write}$=3.0V) is $V_{adj}$ (1.8V). Since this potential difference just corresponds to the central position of the hysteresis characteristics (see FIG. 3), no change occurs in a capacitor CP connected between the drive line DL and the bit line BL.

With the above operation, residual polarization is caused by the potential difference $V_{adj}-V_{write}$ (1.8V–3.0V) in the capacitor CP connected to the bit line BL, whereas residual polarization is caused by the potential difference $V_{adj}+V_{write}$ (1.8V+3.0V) in the capacitor CP connected to the bit line BL'. That is, residual polarization occurs in the two capacitors in the opposite, positive and negative directions with respect to the central position of the hysteresis characteristics.

Upon completion of the above operation, the word line is returned to a non-selection state, activation of the sense amplifier 5 is released, and pre-charge of the bit line is started to complete the write operation.

In the holding state upon completion of the write operation, the potentials of the bit lines BL and BL' are held at 0V by the pre-charge circuit 4, and the potential of the drive line is held at the adjustment voltage $V_{adj}$. If no write or read operation is successively performed, the I/O mode is restored to the standby mode. That is, a voltage for turning on the MOS transistors is applied to all the word lines to apply the potential difference $V_{adj}$ suitable for holding data in all the capacitors.

A method of reading out digital information (logic value of 0 or 1) stored in the capacitor CP in the I/O mode will be explained below.

To switch the standby mode to the I/O mode, all the word lines WL and WL' are set to 0V to turn off the MOS transistors TR.

Note that capacitors connected to the bit lines BL hold residual polarization in the negative direction (the drive line DL side is negative, and the MOS transistor side is positive), whereas capacitors CP connected to the bit lines BL' hold residual polarization in the positive direction (the drive line DL side is positive, and the MOS transistor side is negative).

The bit lines BL and BL' are held at 0V by the pre-charge circuit 4 in the standby mode. In this state, the pre-charge signal $\phi_{pre}$ is disabled to set the bit lines BL and BL' in the floating state. In a specific column corresponding to address information representing the position of a memory cell subjected to a read operation, a voltage required to turn on the MOS transistor TR is applied to the word line, and the bit line is connected to the capacitor through the turned-on MOS transistor. At this time, in the columns except for the corresponding column, the bit lines and the capacitors remain electrically disconnected because no voltage for turning on the MOS transistors TR is applied to the word lines.

The potential of the drive line DL is fixed to the adjustment potential $V_{adj}$ (1.8V) subsequently to the standby mode. In this state, the potential differences between the drive line DL (potential $V_{adj}$=1.8V), and the bit line BL (potential=0) and the bit line BL' (potential=0) are $V_{adj}$. Since the potential differences just correspond to the central position of the hysteresis characteristics (see FIG. 3), no change occurs in capacitors CP connected between the drive and bit lines DL and BL and the drive and bit lines DL and BL'.

A voltage $V_{adj}+V_{read}$ (1.8V+3.0V in this case) high enough to invert polarization of the capacitor CP is applied to the drive line DL. At this time, polarization occurs in the positive direction (the drive line DL side is positive, and the MOS transistor side is negative) in both the capacitors connected between the drive and bit lines DL and BL and the drive and bit lines DL and BL'. In this case, the capacitor CP connected to the bit line BL has residual polarization in the negative direction in advance, and the capacitor CP connected to the bit line BL' has residual polarization in the positive direction in advance. Therefore, the capacitor CP connected to the bit line BL has a larger electric charge amount to be extracted than that of the capacitor CP connected to the bit line BL'. Although the potentials of both the bit lines BL and BL' in the floating state increase, the potential of the bit line BL becomes higher than that of the bit line BL'.

To amplify and stabilize the potentials of the pair of bit lines BL and BL' generated in this stage, the sense amplifier connected to this pair of bit lines BL and BL' is activated. At this time, the potential of the bit line BL is fixed at a sufficiently high potential $V_{read}$ by the activated sense amplifier 5. This potential $V_{read}$ is read through the I/O connection circuit 6 to complete the read operation.

When no write or read operation is successively performed, the I/O mode is restored to the standby mode. That is, a voltage for turning on the MOS transistors is applied to all the word lines to apply the potential difference $V_{adj}$ suitable for holding data in all the capacitors.

The second example of the operation mode of the memory device in FIG. 1 will be explained. In this example, the ferroelectric thin film capacitor shown in FIGS. 2A to 2F is used as the capacitor CP constituting the memory cell (active or dummy cell 1a or 1b) in FIG. 1, and an enhancement transistor is used as the transfer gate MOS transistor TR.

The standby mode for holding digital information (logic value of 0 or 1) stored in the capacitor CP will be first explained.

In the standby mode, the following three types of operations are repeatedly executed at proper time intervals by proper sequences to keep the potential difference between the two electrodes of the capacitor at $V_{adj} \pm \Delta V$. That is, (A) after the bit lines BL and BL' are discharged to 0V by the pre-charge circuits 4, they are disconnected and set in the floating state. (B) After the drive lines DL are charged to the adjustment potential $V_{adj}$ (1.8V) by the drive line drive circuits 3, the drive lines DL are disconnected and set in the floating state. (C) A voltage for turning on the MOS transistors is applied to the word lines WL by the word line drive circuit 2, all MOS transistors connected to selected word lines WL are turned on, and the potential of each bit line BL is made equal to that of one electrode of a corresponding capacitor CP. Note that the absolute value of $\Delta V$ must be smaller than that of $V_{adj}$.

In the above case, the time interval and the sequence are properly set as far as the potential difference between the two electrodes of the capacitor can be kept at $V_{adj} \pm \Delta V$. For example, charging and disconnection are performed for the bit and drive lines every 10 min, and a voltage pulse for turning on the MOS transistors is applied to the word lines every 5 min to hold the potential difference between the two electrodes of each capacitor at 1.8V±0.5V.

In addition to the above method, a plurality or all of the bit, drive, and word lines may be simultaneously selected, or the bit and word lines may be selected in synchronism with each other.

The I/O mode for performing write and read operations will be explained.

In this example, the standby mode has a period when all the bit lines BL, drive lines DL, and word lines WL are in the non-selection state. Therefore, the standby mode can be directly shifted to the I/O mode except for a period when the bit line BL, the drive line DL, or the word line WL is selected and operated. In the I/O mode, the same write and read operations as those of a normal FRAM can be performed, as in the first example described above.

During the I/O mode, a charging operation for holding data with respect to the bit and drive lines, and an ON voltage application operation for the MOS transistor with respect to the word line can be interposed between the write and read operations. Even if these operations are performed, the memory contents held in the capacitor during the I/O mode are not lost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device comprising:
   a plurality of memory cells arranged in a matrix format, each memory cell having a thin film capacitor with a ferroelectric film and a pair of electrodes opposing each other through said ferroelectric film, and a transfer gate transistor arranged to be connected to said thin film capacitor, in which an operating voltage value corresponding to a central axis of a polarization hysteresis characteristic curve of said thin film capacitor has a shift from 0V;
   drive means for driving said transistor and said thin film capacitor in order to perform write and read operations for said memory cells; and
   adjustment means for keeping a potential difference between said electrodes of said capacitor within a certain range excluding zero when no write or read operation is performed for a corresponding memory cell.

2. A device according to claim 1, wherein said adjustment means comprises control means for controlling said drive means to turn on said transistor and to apply an adjustment voltage set to fall within said certain range across said electrodes of said thin film capacitor.

3. A device according to claim 2, wherein said control means operates to turn on said transistor and to constantly apply the adjustment voltage across said electrodes of said thin film capacitor, substantially over a period when no write or read operation is performed for said corresponding memory cell.

4. A device according to claim 2, wherein said control means operates to turn on said transistor at an interval and to periodically apply the adjustment voltage across said electrodes of said thin film capacitor, substantially over a period when no write or read operation is performed for said corresponding memory cell.

5. A device according to claim 2, wherein said shift from 0V is represented by Vf and said certain range is set to be between 0 and 2 Vf.

6. A device according to claim 1, wherein said transistor comprises a pair of source and drain regions formed in a semiconductor substrate, one of the source and drain regions is connected to one of said electrodes of said thin film capacitor, and said adjustment means applies an adjustment voltage set to fall within said certain range across said substrate and the other electrode of said capacitor.

7. A device according to claim 6, wherein said shift from 0V is represented by Vf and said certain range is set to be between 0 and 2 Vf.

8. A device according to claim 1, wherein one of said electrodes provides an underlying surface orientated in one direction, and said ferroelectric film comprises one of a single-crystal film grown on said underlying surface, and a polycrystalline film grown on said underlying surface and orientated in one direction between said electrodes.

9. A device according to claim 8, wherein a lattice constant of a material of said underlying surface is smaller than that of a material of said ferroelectric film, and a crystal of said ferroelectric film is deformed such that the lattice constant decreases in a direction parallel to said underlying surface and increases in a direction of thickness thereof.

10. A device according to claim 9, wherein the material of said ferroelectric film is expressed by a composition of $Ba_x\alpha_{1-x}Ti_y\beta_{1-y}O_3$ ($0<x\leq 1$, $0<y\leq 1$) in which $\alpha$ consists of one or a plurality of materials selected from the group consisting of Sr and Ca, and $\beta$ consists of one or a plurality of materials selected from the group consisting of Sn, Zr, Hf, Mg, Ta, Nb, and Zn.

11. A device according to claim 10, wherein a material of one of said electrodes which provides said underlying surface consists of a material selected from the group consisting of platinum, gold, palladium, iridium, rhodium, rhenium, and ruthenium, alloys thereof, and oxides thereof, and conductive perovskite crystal including strontium ruthenate and strontium molybdate.

12. A device according to claim 1, wherein said shift from 0V is represented by Vf and said certain range is set to be between 0 and 2 Vf.

13. A semiconductor memory device comprising:
   a plurality of memory cells arranged in a matrix format, each memory cell having a thin film capacitor with a ferroelectric film and a pair of electrodes opposing each other through said ferroelectric film, and a transfer gate MOS transistor arranged to be connected to said thin film capacitor, in which an operating voltage value corresponding to a central axis of a polarization hysteresis characteristic curve of said thin film capacitor has a shift from 0V;

drive means for driving said transistor and said thin film capacitor in order to perform write and read operations for said memory cells, said drive means having a bit line connected to one of said electrodes of said capacitor through a source and drain of said transistor, a word line connected to a gate of said transistor, and a drive line connected to the other electrode of said capacitor; and control means for controlling said drive means so as to keep a potential difference between said electrodes of said capacitor within a certain range excluding zero when no write or read operation is performed for a corresponding memory cell, said control means operating to turn on said transistor through said word line and to constantly apply an adjustment voltage set to fall within said certain range across said electrodes of said thin film capacitor through said bit and drive lines, substantially over a period when no write or read operation is performed for said corresponding memory cell.

14. A device according to claim 13, wherein one of said electrodes provides an underlying surface orientated in one direction, and said ferroelectric film comprises one of a single-crystal film grown on said underlying surface, and a polycrystalline film grown on said underlying surface and orientated in one direction between said electrodes.

15. A device according to claim 14, wherein a lattice constant of a material of said underlying surface is smaller than that of a material of said ferroelectric film, and a crystal of said ferroelectric film is deformed such that the lattice constant decreases in a direction parallel to said underlying surface and increases in a direction of thickness thereof.

16. A device according to claim 15, wherein the material of said ferroelectric film is expressed by a composition of $Ba_x\alpha_{1-x}Ti_y\beta_{1-y}O_3 (0<x\leq 1, 0<y\leq 1)$ in which $\alpha$ consists of one or a plurality of materials selected from the group consisting of Sr and Ca, and $\beta$ consists of one or a plurality of materials selected from the group consisting of Sn, Zr, Hf, Mg, Ta, Nb, and Zn.

17. A device according to claim 16, wherein a material of one of said electrodes which provides said underlying surface consists of a material selected from the group consisting of platinum, gold, palladium, iridium, rhodium, rhenium, and ruthenium, alloys thereof, and oxides thereof, and conductive perovskite crystal including strontium ruthenate and strontium molybdate.

18. A device according to claim 13, wherein said shift from 0V is represented by Vf and said certain range is set to be between 0 and 2 Vf.

19. A semiconductor memory device comprising:

a plurality of memory cells arranged in a matrix format, each memory cell having a thin film capacitor with a ferroelectric film and a pair of electrodes opposing each other through said ferroelectric film, and a transfer gate MOS transistor arranged to be connected to said thin film capacitor, in which an operating voltage value corresponding to a central axis of a polarization hysteresis characteristic curve of said thin film capacitor has a shift from 0V;

drive means for driving said transistor and said thin film capacitor in order to perform write and read operations for said memory cells, said drive means having a bit line connected to one of said electrodes of said capacitor through a source and drain of said transistor, a word line connected to a gate of said transistor, and a drive line connected to the other electrode of said capacitor; and control means for controlling said drive means so as to keep a potential difference between said electrodes of said capacitor within a certain range excluding zero when no write or read operation is performed for a corresponding memory cell, said control means operating to turn on said transistor through said word line at an interval and to periodically apply an adjustment voltage set to fall within said certain range across said electrodes of said thin film capacitor through said bit and drive lines, substantially over a period when no write or read operation is performed for said corresponding memory cell.

20. A device according to claim 19, wherein one of said electrodes provides an underlying surface orientated in one direction, and said ferroelectric film comprises one of a single-crystal film grown on said underlying surface, and a polycrystalline film grown on said underlying surface and orientated in one direction between said electrodes.

21. A device according to claim 20, wherein a lattice constant of a material of said underlying surface is smaller than that of a material of said ferroelectric film, and a crystal of said ferroelectric film is deformed such that the lattice constant decreases in a direction parallel to said underlying surface and increases in a direction of thickness thereof.

22. A device according to claim 21, wherein the material of said ferroelectric film is expressed by a composition of $Ba_x\alpha_{1-x}Ti_yO<x\leq 1\ 0<y\leq 1)$ in which a consists of one or a plurality of materials selected from the group consisting of Sr and Ca, and $\beta$ consists of one or a plurality of materials selected from the group consisting of Sn, Zr, Hf, Mg, Ta, Nb, and Zn.

23. A device according to claim 22, wherein a material of one of said electrodes which provides said underlying surface consists of a material selected from the group consisting of platinum, gold, palladium, iridium, rhodium, rhenium, and ruthenium, alloys thereof, and oxides thereof, and conductive perovskite crystal including strontium ruthenate and strontium molybdate.

24. A device according to claim 19, wherein said shift from 0V is represented by Vf and said certain range is set to be between 0 and 2 Vf.

* * * * *